United States Patent
Glaser et al.

(10) Patent No.: US 7,618,188 B2
(45) Date of Patent: Nov. 17, 2009

(54) SENSOR ELEMENT HAVING AT LEAST ONE MEASUREMENT ELEMENT WITH PIEZOELECTRIC AND PYROELECTRIC PROPERTIES

(75) Inventors: Josef Glaser, Graz (AT); Dietmar Kroeger, Graz (AT); Gernot Leuprecht, St. Radegund-Rinnegg (AT); Christian Reiter, Graz (AT)

(73) Assignee: Piezocryst Advanced Sensorics GmbH, Graz (AT)

( * ) Notice: Subject to any disclaimer, the term of this patent is extended or adjusted under 35 U.S.C. 154(b) by 192 days.

(21) Appl. No.: 11/664,498

(22) PCT Filed: Oct. 7, 2005

(86) PCT No.: PCT/AT2005/000400

§ 371 (c)(1),
(2), (4) Date: Jun. 12, 2007

(87) PCT Pub. No.: WO2006/037145

PCT Pub. Date: Apr. 13, 2006

(65) Prior Publication Data

US 2007/0283769 A1     Dec. 13, 2007

(30) Foreign Application Priority Data

Oct. 7, 2004 (AT) ................ A 1677/2004

(51) Int. Cl.
*G01K 5/00* (2006.01)
(52) U.S. Cl. .................................... 374/197
(58) Field of Classification Search ......... 374/120, 374/133, 197; 250/338, 349
See application file for complete search history.

(56) References Cited

U.S. PATENT DOCUMENTS

| 3,060,748 A | | 10/1962 | Schwartz |
| 3,581,092 A | * | 5/1971 | Pearsall et al. ............... 250/349 |
| 3,877,308 A | | 4/1975 | Taylor |
| 4,060,729 A | * | 11/1977 | Byer et al. ............... 250/338.3 |
| 4,467,202 A | * | 8/1984 | Nakamura et al. ....... 250/338.3 |
| 4,514,631 A | * | 4/1985 | Guscott ..................... 250/342 |

(Continued)

FOREIGN PATENT DOCUMENTS

| DE | 0055345 | 7/1982 |
| GB | 2224598 | 5/1990 |

*Primary Examiner*—Andre J Allen
(74) *Attorney, Agent, or Firm*—Dykema Gossett PLLC

(57) ABSTRACT

A sensor element (1) has at least one measurement element (2) with piezoelectric and pyroelectric properties, and measurement electrodes (3). A measurement variable and a disturbance variable act simultaneously upon the at least one measurement element (2) and the measurement signal derived from the measurement electrodes (3) includes an interference signal. The sensor element (1) has at least one compensation element (4, 4') upon which only the disturbance variable acts, so that a correction signal used to compensate for the interference signal in the measurement signal can be derived from the compensation element (4, 4'). The invention consists in that the compensation element (4, 4') is in thermal contact with a first support (10) and with a second support (11) of the measurement element (2), or with the measurement element (2), over its length between the supports (10, 11), so that substantially the same temperature field is established in the measurement element (2) and in the compensation element (4, 4').

18 Claims, 9 Drawing Sheets

U.S. PATENT DOCUMENTS

| | | | |
|---|---|---|---|
| 4,542,294 A * | 9/1985 | Tamura et al. | 250/338.3 |
| 4,792,682 A | 12/1988 | Endou et al. | |
| 4,841,494 A | 6/1989 | Banno | |
| 5,677,487 A | 10/1997 | Hansen | |

* cited by examiner

SENSOR ELEMENT HAVING AT LEAST ONE MEASUREMENT ELEMENT WITH PIEZOELECTRIC AND PYROELECTRIC PROPERTIES

BACKGROUND OF THE INVENTION

1. Field of the Invention

The invention relates to a sensor element which includes at least one measuring element, having piezoelectric and pyroelectric properties and is provided with measuring electrodes, where a measurement variable and a disturbance variable simultaneously act on the measuring element and the measurement signal picked up by the measuring electrodes contains a noise signal, and further including at least one compensating element with only the disturbance variable acting on the compensating element, such that a correction signal can be obtained from the compensating element, which may be used to compensate for the noise signal in the measurement signal.

2. The Prior Art

Piezoelectric sensor elements for measuring mechanical quantities, such as pressure, force, or acceleration, have a wide range of applications, the advantage of these sensors being in particular a high possibility of miniaturization and the practically movement-free measurement of the quantities cited. Different piezoelectric materials are used for different ranges of measurement, which tend to be rather expensive (e.g. $GaPO_4$ for the high-temperature range) and/or not easily available, however.

Many piezoelectric materials (as for instance tourmaline) are well suited for sensor applications due to their high temperature stability and high piezoelectric sensitivity, but are, besides their piezoelectric properties, also pyro-electric, which is undesirable in many applications. Pressure measurements in areas with changing temperature conditions (for instance in combustion chambers of internal combustion engines) with the use of piezoelectric materials featuring pyroelectric properties as well, are accompanied by a disturbance signal which cannot be discerned from the measuring signal itself.

The reason for the disturbance signal, for instance in the case of a pressure sensor, lies in the fact that electrical charge is generated on the piezoelectric element not only by the pressure applied but also on account of temperature changes, which will result in an electrical signal having a signal component dependent on pressure change and a signal component dependent on temperature change.

In this context a force sensor for dynamic and/or quasistatic forces has become known from EP 0 055 345 A1, in which two piezoceramic platelets are located in a closed housing, one of which is connected with a coupling element transmitting the force, while the other one is a compensating element for noise signals of non-mechanical origin. The force pick-up and the compensating element have the same geometry, the difference being that force can be transmitted only to the force pick-up. The compensating element is separated from the force transmitting structure by an air gap, such that no force transmission is possible and only signals of non-mechanical origin can be registered.

An essential disadvantage of the force sensor according to the above EP 0 055 345 A1 lies in the fact that in the case of differing temperatures $T_1$ and $T_2$ in the force-transmitting structures, or if temperature $T_1$ or $T_2$ changes rapidly, different temperature gradients or temperature fields arise in the measuring element and in the compensating element and thus satisfactory compensation is not possible.

In a measurement set-up according to FIG. 3 of EP 0 055 345 A1 a temperature gradient depending on the temperatures $T_1$ and $T_2$ would arise in the measuring element if temperature $T_1$ in the base or $T_2$ in the shell would differ, while the compensation element would essentially assume the temperature $T_1$ of the base. This effect would even be strengthened if the temperatures would change over time, as is the case for instance when pressure is measured in the combustion chambers of internal combustion engines.

It is the object of the present invention to improve a sensor element with a measuring element with both piezoelectric and pyroelectric properties in such a way that a disturbance-free measuring signal can be obtained in as simple a manner as possible.

SUMMARY OF THE INVENTION

The invention achieves its object by providing that the compensating element is in thermal contact with a first and a second measuring element support of the measuring element or with the measuring element along its lengthwise extension between the measuring element supports, resulting in essentially the same temperature field in the measuring element and in the compensating element. In longitudinal direction between the measuring element supports the compensating element has essentially the same length as the measuring element, such that the temperature distribution is integrated along this path. This leads to optimal compensation of the temperature dependent signal components, even if the temperature load varies over space or time.

In all embodiments of the invention, in which the compensating element also has piezoelectric and/or pyroelectric properties, the compensating element is decoupled as regards the transmission of mechanical quantities, from at least one of the measuring element supports. For example, the compensating element may be furnished with an element which absorbs mechanical forces and is a good heat conductor, against one measuring element support.

It is of particular advantage to choose the size of the area of the compensating electrodes relative to the area of the measuring electrodes in such a way that the disturbance variable is compensated, and to establish an electrically conductive connection between the electrodes. This will advantageously result in an internal compensation of the disturbance variable at the measuring element without electronic signal processing.

If, for instance, the force F is the variable to be measured and the mean temperature T is the disturbance variable, the total signal S will consist of a signal component $S_{ME}$ of the measuring element and a signal component $S_{KE}$ of the compensating element, the signal components depending on the following quantities:

$$S_{ME} = F \times E_{piezo} \times A_{ME} + T \times E_{pyro} \times A_{ME} \qquad (1)$$

$$S_{KE} = T \times E_{pyro}^* \times A_{KE} \qquad (2)$$

with
  $E_{piezo}$ piezoelectric sensitivity of measuring element
  $E_{pyro}$ pyroelectric sensitivity of measuring element
  $E_{pyro}^*$ pyroelectric sensitivity of compensating element
  $A_{ME}$ electrode area of the measuring electrodes
  $A_{KE}$ electrode area of the compensating electrodes
When $S_{KE}$ is subtracted from $S_{ME}$, there follows:

$$S = S_{ME} - S_{KE} = F \times E_{piezo} \times A_{ME} + T \times E_{pyro} \times A_{ME} - T \times E_{pyro}^* \times \text{ and}$$

$$S = F \times E_{piezo} \times A_{ME} + T \times (E_{pyro} \times A_{ME} - E_{pyro}^* \times A_{KE}) \qquad (3)$$

The expression in brackets is zero, i.e. complete compensation of the pyroelectric effect is achieved, if the products of pyroelectric sensitivity and electrode area of the measuring element and of the compensating element are equal. If different materials are used for the measuring element and the compensating element the electrode area of the compensating element can be chosen relative to the electrode area of the measuring element in such a way that complete compensation is achieved.

In this context it is of particular advantage if the at least one measuring element and the at least one compensating element are of the same material. $E_{pyro}$ and $E_{pyro}*$ will then be equal and the electrode areas $A_{ME}$ and $A_{KE}$ can also be chosen of equal size.

If the variable to be measured is for instance a mechanical quantity, such as force, pressure, stress, or acceleration, and the disturbance variable to be taken into account is the variable temperature at the measuring site, care should be taken to have the measuring element and the compensating element in one and the same temperature field, i.e. that the same temperature as a function of time acts on both elements. In addition, the measurement arrangement must be such that only the disturbance variable, e.g. the temperature, acts on the compensating element. By connecting the measuring electrodes with the compensation electrodes of opposite polarity (see e.g. FIG. 2) the charge components due to the temperature load are compensated, resulting in a measurement signal which is proportional to the charge components generated by the applied pressure.

According to a variant of the invention it is also possible to connect the compensating electrodes with the measuring electrodes via an interposed electronic amplifying element. In this case there is no internal compensation, but compensation is achieved by suitable amplification of the signal component $S_{KE}$.

The electrode area of the compensating element or the gain of an amplifying element can also be chosen such that besides the pyroelectric effect other disturbance effects are compensated, for instance, temperature-proportional error signals due to stresses between measuring element and measuring element support.

If according to an other variant of the invention the measurement variable is a varying temperature and the disturbance variable is a varying mechanical quantity, such as force, pressure, stress, or acceleration, care should be taken that the compensating element is only subjected to the mechanical variable and not to the temperature. In this case the result is a pressure-compensated temperature sensor, which is characterised by the fact that measuring element and compensating element are placed in the same force field in serial arrangement between a first and second measuring element support, with an electrically and thermally insulating spacer element located between measuring element and compensating element.

In analogy to equations (1) to (3) there results a total signal S $$S = F \times E_{pyro} \times A_{ME} + T \times (E_{piezo} \times A_{ME} - E_{piezo}* \times A_{KE}) \quad (4)$$

with $E_{pyro}$ pyroelectric sensitivity of measuring element
$E_{piezo}$ piezoelectric sensitivity of measuring element
$E_{piezo}*$ piezoelectric sensitivity of compensating element.

Complete compensation of the piezoelectric effect is achieved if the products of piezoelectric sensitivity times electrode area are equal for the measuring element and the compensating element and therefore the expression in brackets is zero.

According to a further variant of the invention the measuring element and the compensating element may be realized in two partial regions of a single piezoelectric element, with a first partial region carrying the measuring electrodes and a second partial region the compensating electrodes.

The invention will now be explained in more detail with reference to the enclosed schematical drawings.

DETAILED DESCRIPTION OF THE PREFERRED EMBODIMENTS

Figure 1C:
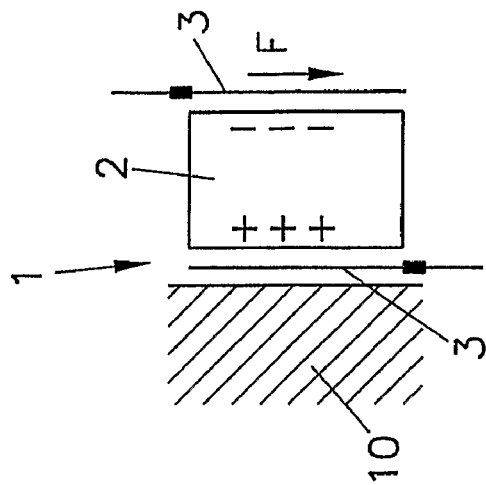
FIG. 1a to FIG. 1c piezoelectric elements and different piezoelectric effects for use with a sensor element according to the invention.
Figure 1B:
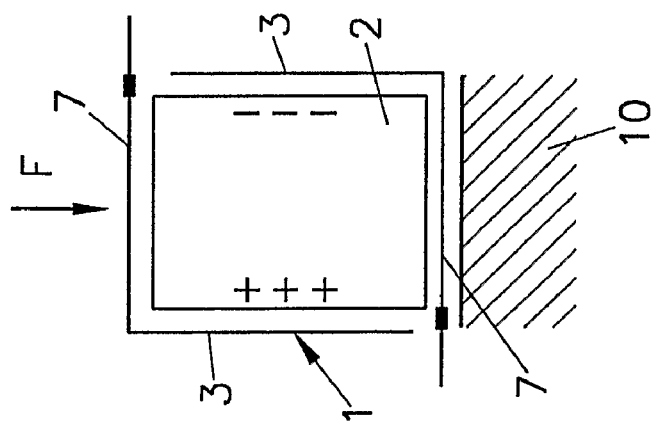
Figure 1A:
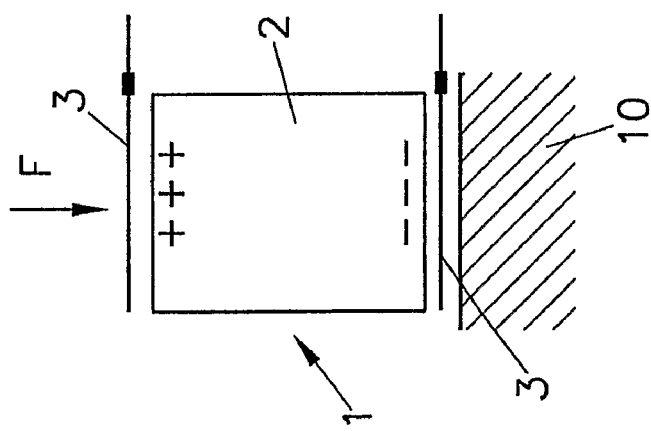

FIGS. 1a, 1b and 1c each show a piezoelectric measuring element 2 of a sensor element 1, where the piezoelectric effects to be used for the present invention are indicated schematically.

In FIG. 1a a force F acts on the piezoelectric measuring element 2, the mechanical load shifting the positive and negative constituents of the crystal lattice in such a way that electrical polarization ensues, which leads to the appearance of electrical charges (+ and −) on opposing surfaces. The charges are picked up by the measuring electrodes 3, with the resulting voltage being proportional to the force F acting on the measuring element 2. FIG. 1a shows the longitudinal piezoelectric effect.

Similar effects occur when force is applied as shown in FIG. 1b (transversal piezoelectric effect) and in FIG. 1c (shear stress), the support of the measuring element each time being indicated by reference numeral 10.

For clarity of presentation the measuring electrodes 3 (for instance, an electrically conductive foil or an electrically conductive coating) are shown at a certain distance from the measuring element 2, which distance is of course not present in the actual device, the same being true for the distance between measuring electrodes 3 and the support 10 of the measuring element.

In the following examples of embodiments of the invention the longitudinal piezoelectric effect as in FIG. 1a is mainly employed, but the invention could equally well employ the other piezoelectric effects shown in FIGS. 1b and 1c.

Figure 2:
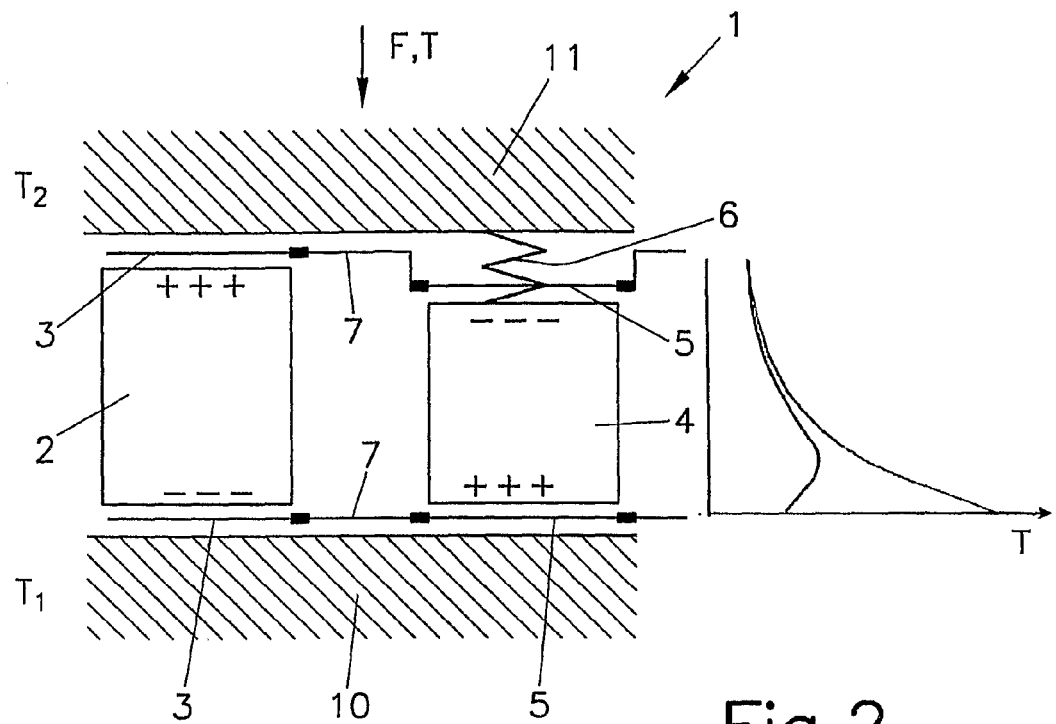
FIG. 2 a sectional view of a first variant of a sensor element according to the invention for measuring a mechanical quantity with separate measuring element and compensating element.

In the first variant of the invention shown in FIG. 2 the sensor element 1 has a measuring element 2 with measuring electrodes 3 attached to opposing faces, and a compensating element 4 in an anti-parallel arrangement, as regards the application of force F and temperature T, which is provided with compensating electrodes 5 on opposing faces. Both elements are located in the same temperature field between a first 10 and a second measuring element support 11 in a parallel, or rather—regarding the dipole formed—in an anti-parallel arrangement, such that the same temperature gradient arises for both elements even when the temperatures $T_1$ and $T_2$ change. In the example shown the compensating element 4 is decoupled from the application of mechanical quantities, and is provided against the measuring element support 11 with an element 6 (also referred to as spring element below), which absorbs mechanical forces while being a good heat conductor, the compensating element 4 thus being subject only to the disturbance variable, i.e. the temperature T, since the mechanical variable F cannot act on the compensating element 4 on account of the spring element 6.

For the sake of better presentation, the spring element 6 is shown with exaggerated height in the schematic drawings. In practical implementation the spring element could be for instance a corrugated platelet of resilient material (e.g. steel) with good heat conducting properties, the measuring element 2 and the compensating element 4 having essentially the same length between the two supports 10 and 11. The limiting temperature curves over one heating/cooling cycle of the cyclical temperature variation of $T_1$ in the measuring element support 10, which are identical for both elements 2 and 4, are shown beside the drawing of sensor element 1. All temperature curves over one cycle lie within these limiting curves.

The measuring element 2 and the compensating element 4 are positioned in an anti-parallel fashion as shown in FIG. 2, and the corresponding electrodes 3 and 5 can thus be directly conductively connected via connecting leads 7.

Different materials with piezoelectric and pyrolelectric properties may be chosen for the measuring element 2 and the compensating element 4. The size of the area of the compensating electrodes 5 must be adapted to the size of the area of the measuring electrode 3 in such a way (see equation 3) that compensation of the disturbance variable is achieved.

It is of particular advantage if the measuring element 2 and the compensating element 4 are made of the same piezoelectric and pyrolelectric material and have equal effective cross-sections. In this case the areas of the measuring electrodes 3 and of the compensating electrodes 5 can be of equal size. The element 6, which absorbs mechanical forces and has good heat-conducting properties, could also be placed on the other side between the compensating element 4 and the measuring element support 10, or an element 6 could be provided on both sides.

Figure 3:
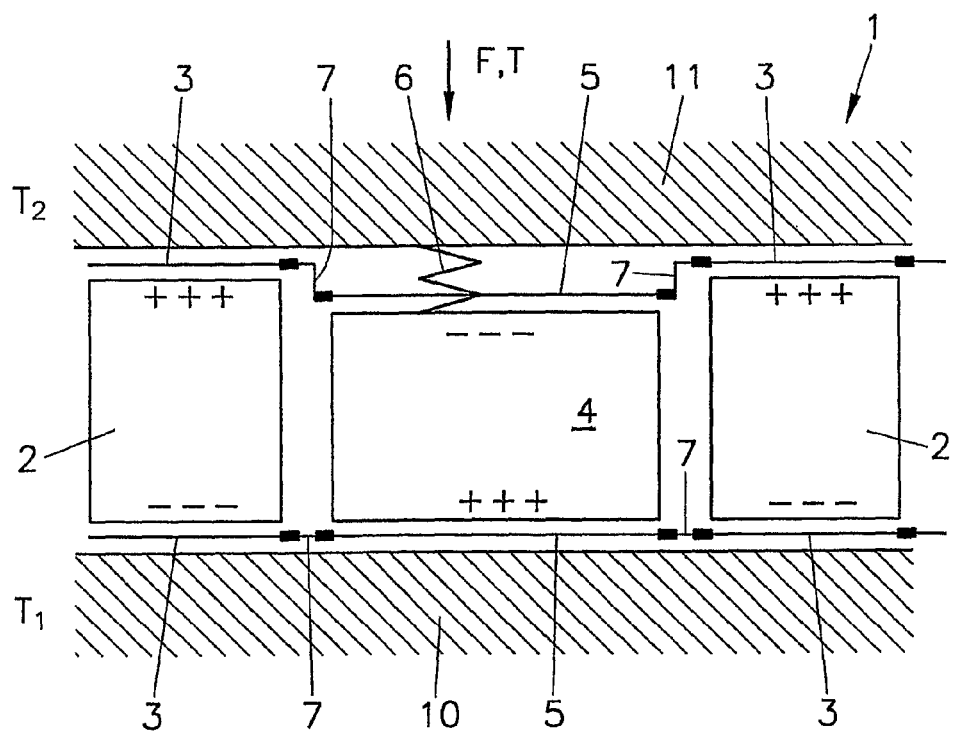
FIG. 3 a variant of the sensor element of FIG. 2.

The embodiment shown in FIG. 3 is similar to that of FIG. 2, the difference being that in this case force may be applied symmetrically and that the effective cross-sections of the measuring and the compensating elements 2, 4 are suitably adapted.

Figure 4:
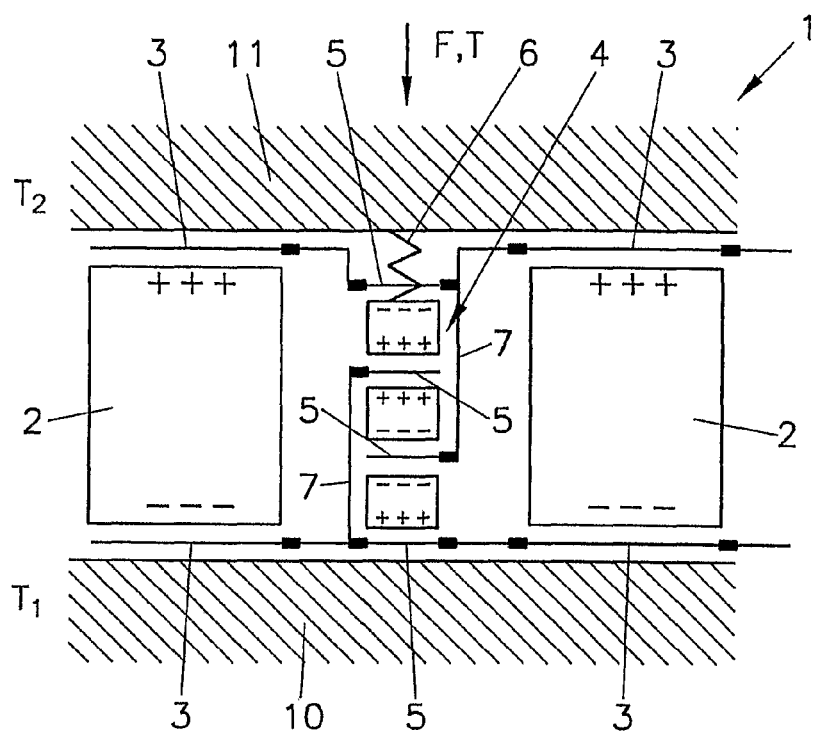
FIG. 4 and FIG. 5 variants of the sensor element, in which the measuring element and/or the compensating element consist of a plurality of single elements.
Figure 5:
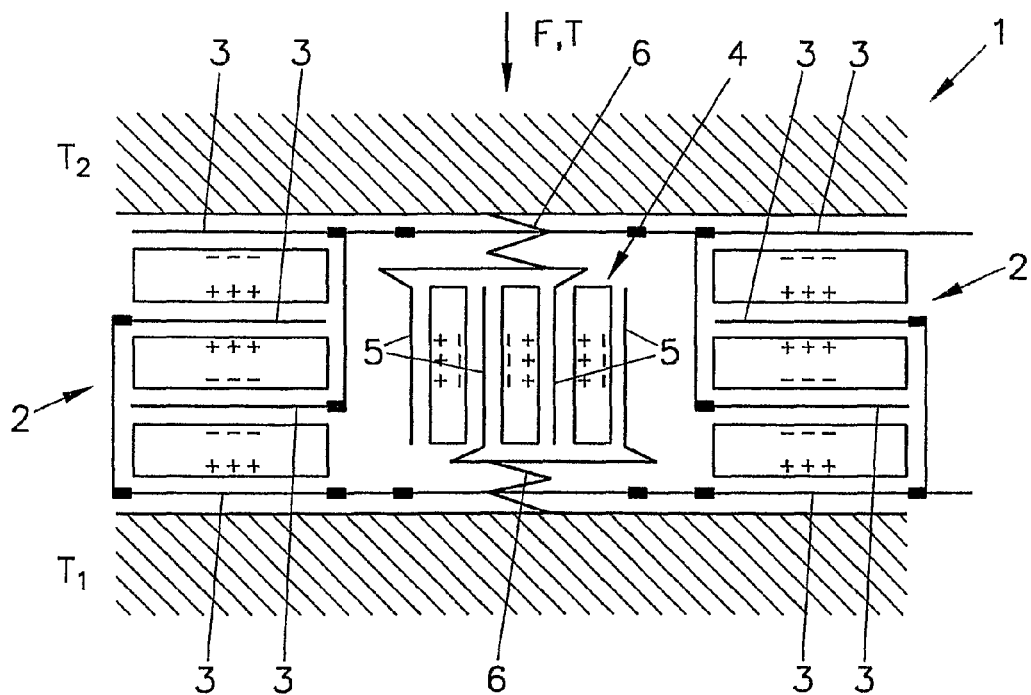

In the variants shown in FIGS. 4 and 5 the measuring element 2 (see FIG. 5) and/or the compensating element 4 (see FIGS. 4 and 5) are made up of a number of single elements of opposite polarity with the longitudinal and the transversal piezo-electric effect being employed, where in FIG. 5 the single elements of the compensating element 4 are rotated by 90°. The required electrode area of the compensating electrodes 5 can thus be realized using a plurality of thin single elements in a space-saving way.

Figure 6:
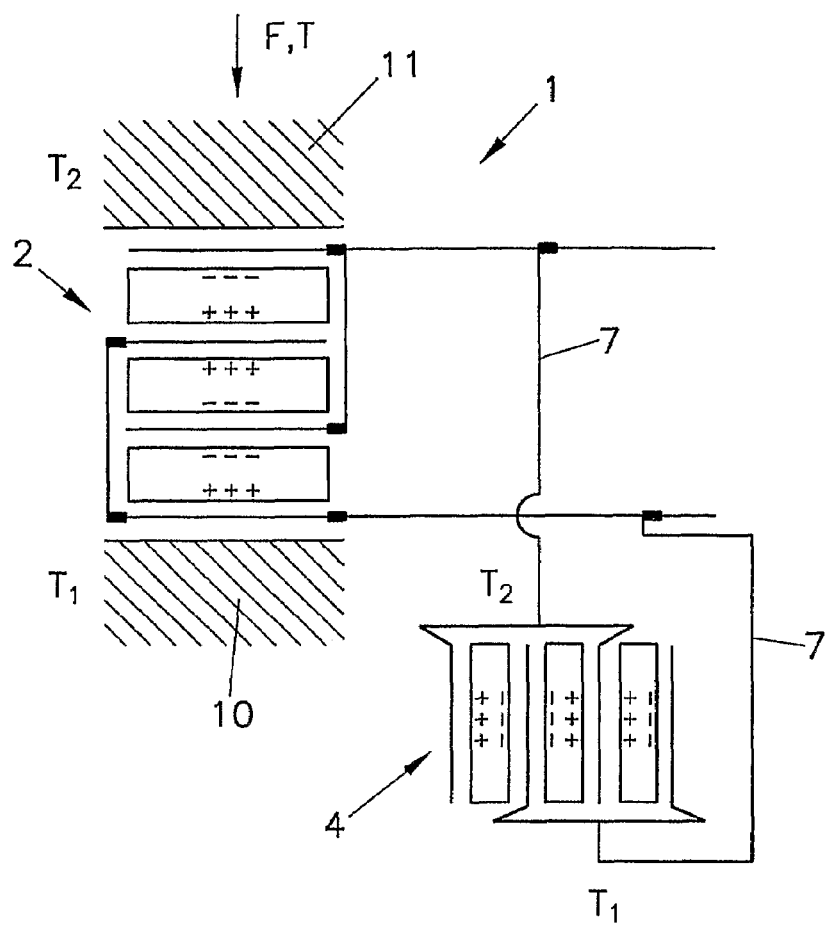
FIG. 6 a variant of the sensor element with externalised compensating element.

As indicated in the variant of FIG. 6, it is also possible to position the compensating element 4 consisting of a plurality of single elements externally, for instance separate from the measuring element supports 10 and 11, as long as it is ensured that the same temperatures $T_1$ and $T_2$ prevail at the location of the measuring element 2 and at the location of the compensating element 4, and that therefore both elements 2 and 4 are exposed to the same temperature field or temperature gradient.

Figure 7:
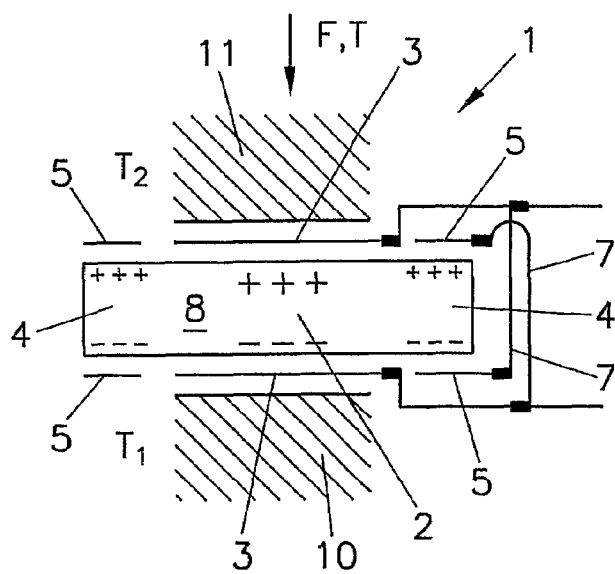
FIG. 7 a variant of the sensor element with the measuring element and the compensating element in one piece.

According to a particularly advantageous variant the measuring element 2 and the compensating element 4 are each realized in a partial region of one and the same single piezoelectric element 8, with a first partial region carrying the measuring electrodes 3 and a second partial region carrying the compensating electrodes 5. As shown in FIG. 7, the measuring region of the element 8 is positioned such that it is influenced by the measuring element supports 10, 11, while the region of the compensating element lies outside this area of influence. By using equal-size electrode areas and suitably disposed electrical connections 7, complete internal compensation of the disturbance variable is achieved.

Figure 8:
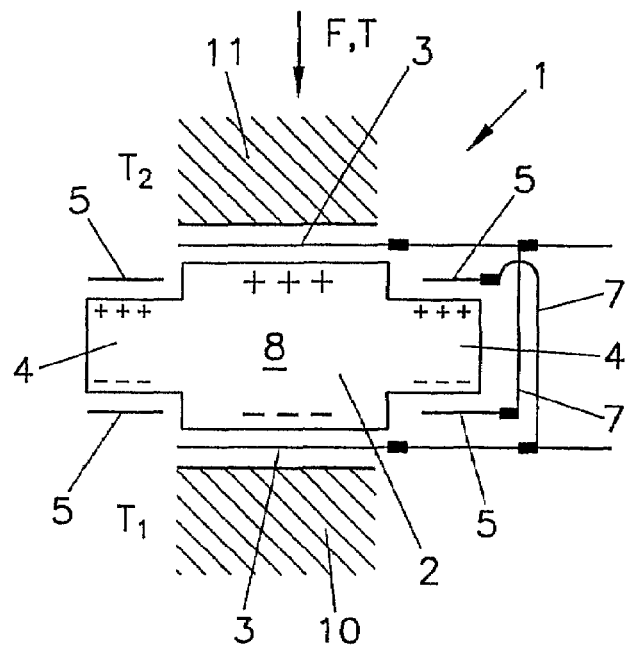
FIG. 8 a sectional view, and FIGS. 8a and 8b oblique views of a variant of the sensor element according to FIG. 7 in a configuration with rotational symmetry.
Figure 8A:
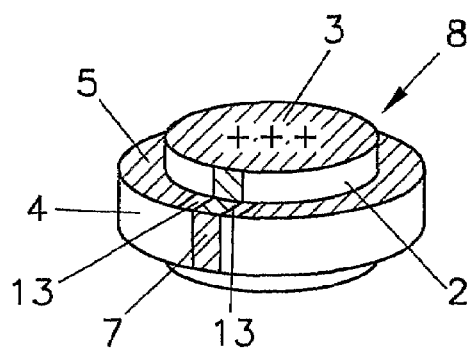
Figure 8B:
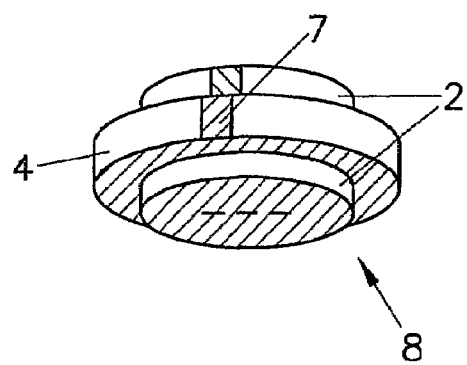

If a single piezoelectric element 8 with internal compensation is used the two partial regions may be configured as concentric cylinders as shown in FIGS. 8, 8a and 8b, where the partial region representing the measuring element 2 has greater thickness than the region representing the compensating element 4. This will guarantee that the measuring element supports 10 and 11 will act only on the measuring region and that several singly compensated elements 8 can be built up to form a measuring element stack in a simple manner. As can be seen from the three-dimensional views of FIGS. 8a and 8b, the electrical connection 7 between the measuring electrodes 3 and the compensating electrodes 5 may be realized in an advantageous way by an electrically conductive coating which is applied directly on the piezoelectric element 8, with insulating gaps 13 separating the electrodes from each other.

Figure 9:
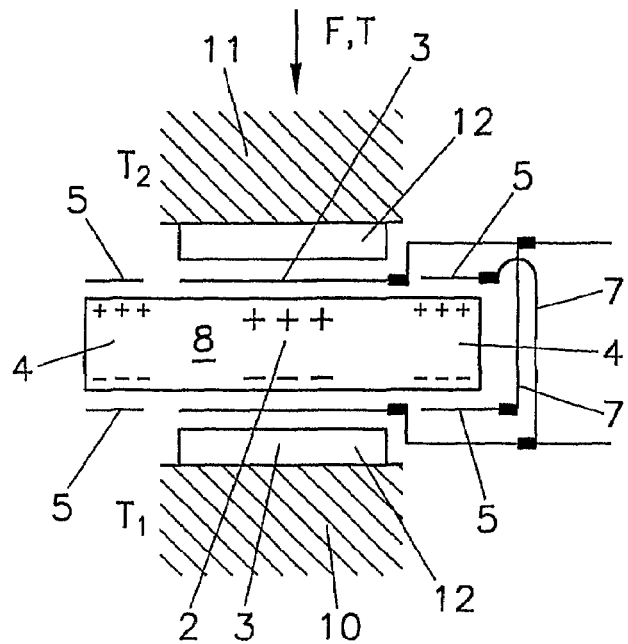
FIG. 9, FIGS. 9a, 9b and FIGS. 10, 10a, 10b variants of the sensor element according to FIG. 8.
Figure 9A:
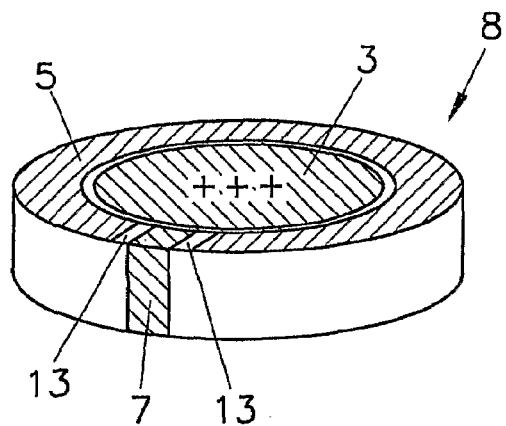
Figure 9B:
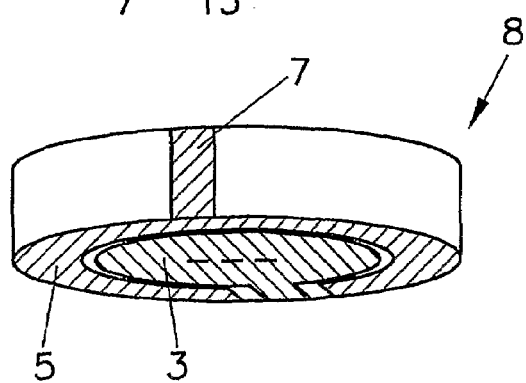

In the sensor element according to FIGS. 9, 9a, 9b the two partial regions of the piezoelectric element 8 are also configured as concentric cylinders, the partial region serving as the measuring element 2 and the partial region serving as the compensating element 4 having the same thickness. The step in thickness of the piezoelectric material is here replaced by conductive intermediate parts 12 or by suitably thickened measuring electrodes 3.

Figure 10:
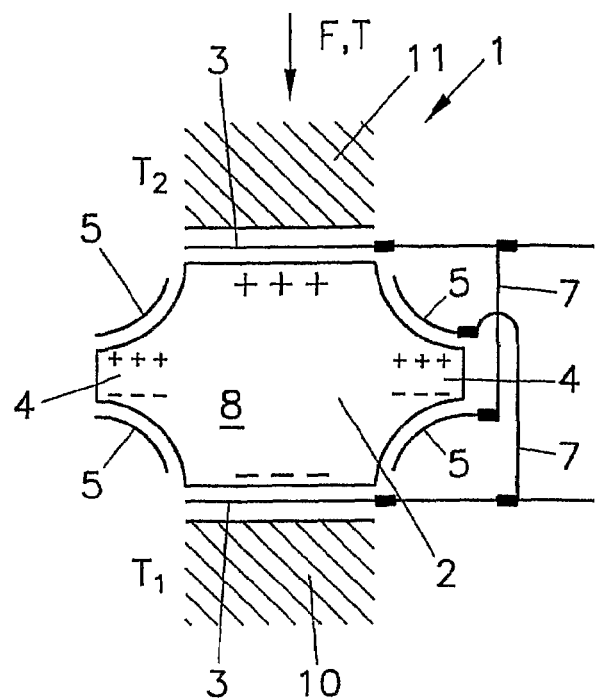
Figure 10A:
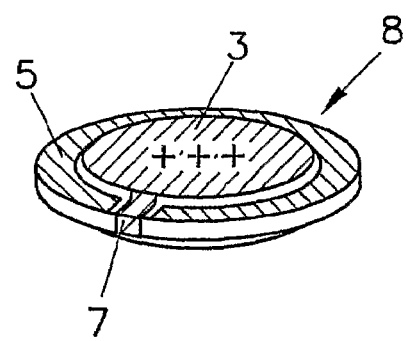
Figure 10B:
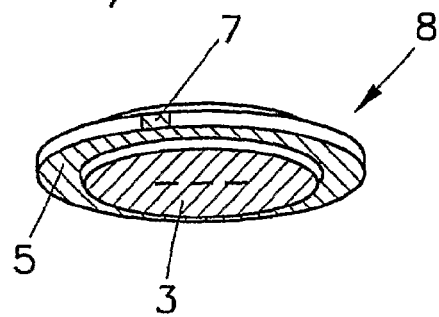

In the variant shown in FIGS. 10, 10a, 10b the transition from the lesser material thickness of the compensating element 4 to the greater material thickness of the measuring element 2 is gradual, avoiding stress concentration, thus resulting in a pellet-shaped element 8 (see FIGS. 10a, 10b) with internal compensation, which can be stacked in simple manner. It would also be possible to realize the measuring element 2 in an outer annular region of greater thickness and to use the inner circular region of lesser thickness for the compensating element 4.

Figure 11:
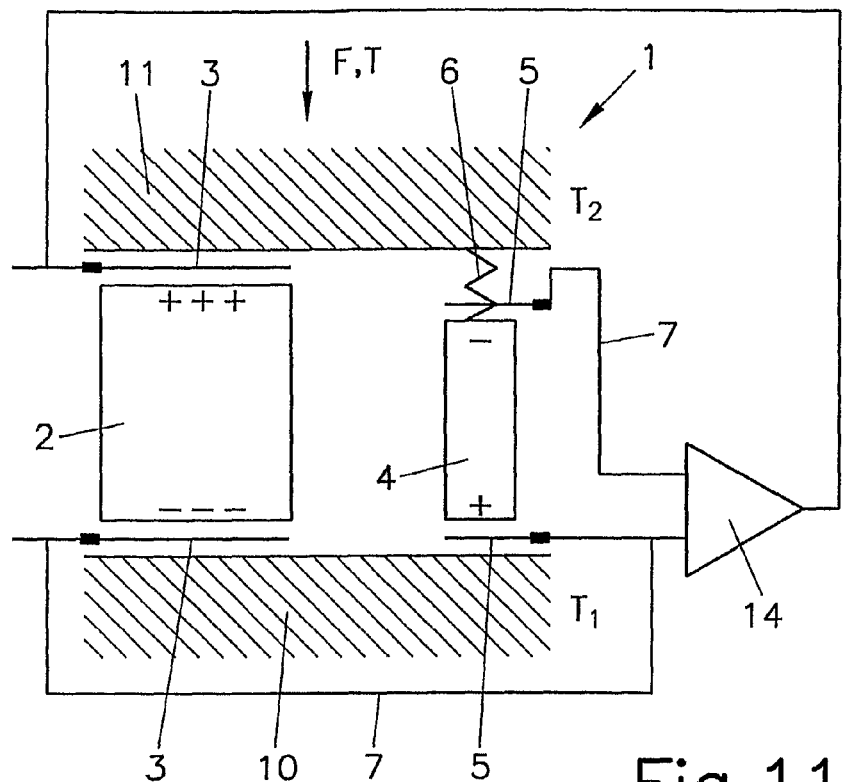
FIG. 11 a variant of the sensor element of FIG. 2 with electronic amplification of the disturbance signal.

The variant of FIG. 11 shows a sensor element 1 with a measuring element 2 and a compensating element 4, which may differ in their dimensions and may be made of differing materials. For compensation of the disturbance variable the compensation electrodes 5 are connected with the measuring electrodes 3 via an intermediate electronic amplifying element 14.

Figure 12:
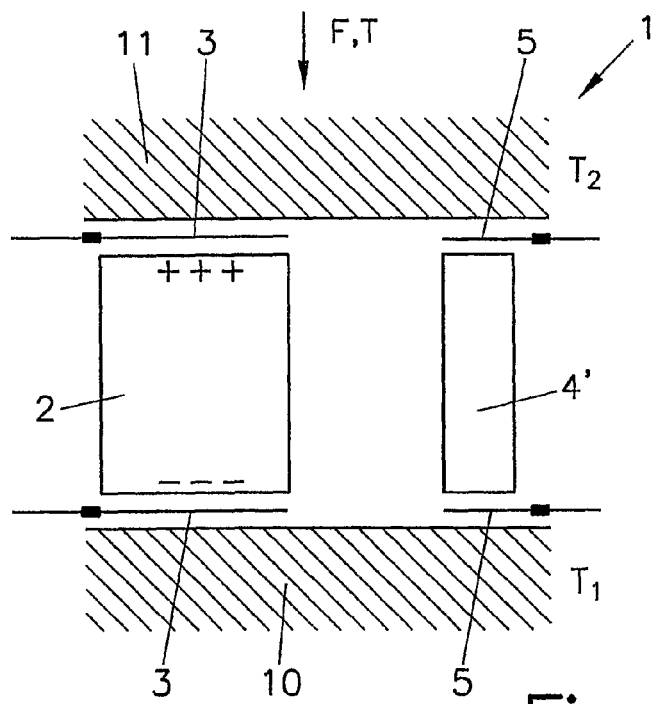
FIG. 12 a pressure sensor according to the invention with a compensating element which is neither piezoelectric nor pyroelectric.

The variant of a pressure sensor shown in FIG. 12 has a compensating element 4' made from a material which is neither piezoelectric nor pyroelectric, and is placed in the same temperature field as the measuring element 2. The compensating element 4' generates a signal proportional to the mean temperature at the site of the measuring element 2, from which after suitable transformation or amplification (not shown) a correction signal may be derived, which can be used to compensate the disturbance signal in the measurement signal. Ideally the compensating element 4' will be located between the two measuring element supports 10 and 11 and will have the same temperature distribution as the measuring element 2 over its entire length. If thermal conductivity and heat capacity are the same as those of the measuring element 2 this will also hold for dynamic processes.

The compensating element 4' can be a resistive element, for instance, which preferably can be placed directly adjacent to an electrically inactive surface of the measuring element 2—extending over the entire length of the measuring element 2—in order to register the mean temperature at the measuring site.

If the temperature distribution between the measuring element supports 10 and 11 is reasonably linear, or if the accuracy of compensation need not meet strict requirements, a correction signal can also be derived from a measurement of the temperatures $T_1$ and $T_2$ of the measuring element supports or even from only one measured temperature, preferably the mean temperature of the measuring element, and the measurement signal may thereby be compensated.

Figure 13:
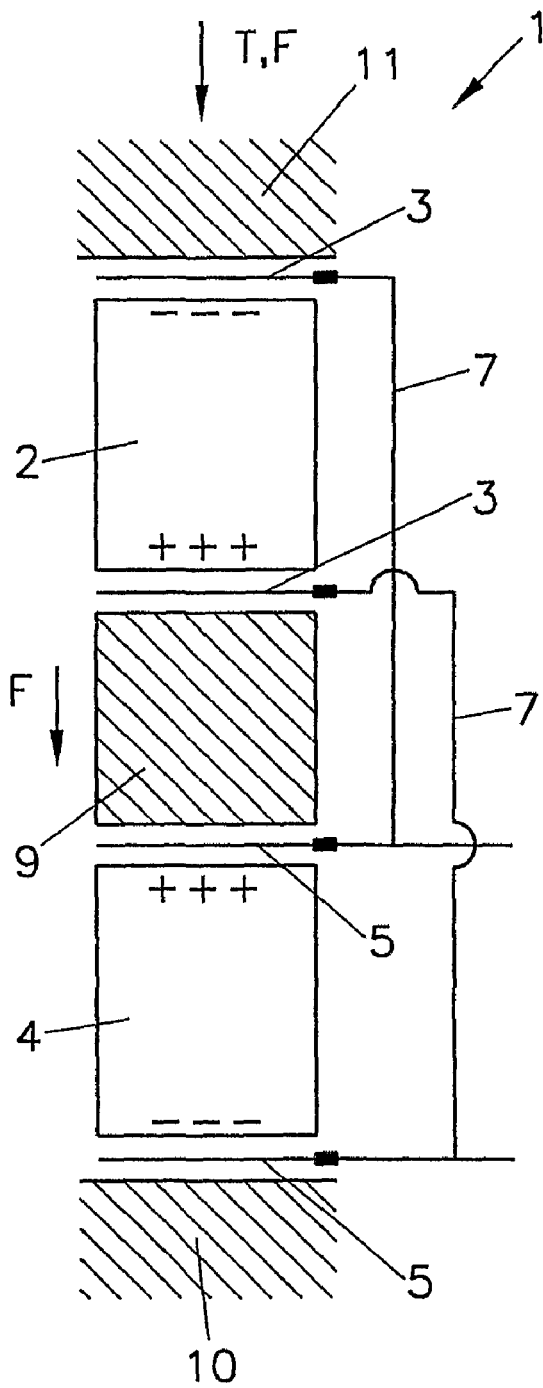
FIG. 13 a temperature sensor according to the invention with internal compensation of the piezoelectric effect.

The variant shown in FIG. 13 is a force-compensated temperature sensor. Here the measuring element 2 and the compensating element 4 are placed in the same force field between a first 10 and a second 11 measuring element support in a serial configuration, with an electrically and thermally insulating spacer element 9 being provided between measuring element 2 and compensating element 4, which transmits the force F acting on the measuring element also onto the compensating element 4. The connection 7 of the measuring electrodes 3 with the compensating electrodes 5, as shown in FIG. 13, will in accordance with equation 4 result in complete internal compensation relative to a varying force F, thus permitting an undisturbed temperature signal to be measured.

The measuring element and also the compensating element can be made from a multitude of known piezoelectric and pyroelectric materials. Piezoceramics or, as concrete examples, tourmaline, lithium niobate, lithium tantalate or polyvinylidene fluoride (PVDF) may be mentioned in this context.

The invention claimed is:

1. A sensor element with at least one measuring element, which has piezoelectric and pyroelectric properties and is provided with measuring electrodes, where a measurement variable and a disturbance variable act simultaneously on the at least one measuring element, and where a measurement signal picked up by the measuring electrodes contains a noise signal, and with at least one compensating element, where only the disturbance variable acts on the compensating element, enabling a correction signal to be derived from the compensating element, which is used to compensate the noise signal in the measurement signal, wherein the compensating element is in thermal contact with a first and a second measuring element support of the measuring element, or with the measuring element along its longitudinal extension between the measuring element supports, such that essentially the same temperature field will prevail in the measuring element and in the compensating element.

2. The sensor element according to claim 1, wherein the compensating element (4) has piezoelectric and/or pyroelectric properties, and is provided with compensating electrodes, and is decoupled from the application of mechanical quantities, against at least one of said measuring element supports.

3. The sensor element according to claim 2, wherein the compensating element is provided with an element, which absorbs mechanical forces and is a good heat conductor, against at least one of said measuring element supports.

4. The sensor element according to claim 2, wherein the compensating electrodes are connected to the measuring electrodes by means of electrically conductive leads, and that the ratio of the areas of the electrodes is such that the disturbance variable is compensated.

5. The sensor element according to claim 2, wherein the compensating electrodes are connected to the measuring electrodes via an intermediate electronic amplifying device.

6. The sensor element according to claim 2, wherein the at least one measuring element and the at least one compensating element are made of the same material.

7. The sensor element according to claim 2, wherein the cross-sections of the measuring element and the compensating element, which are effective for the measurement variable and the disturbance variable, are of equal size.

8. The sensor element according to claim 1, wherein the measurement variable is a varying mechanical quantity, for instance force, pressure, stress, or acceleration, and that the disturbance variable is a varying temperature.

9. The sensor element according to claim 2, wherein the measuring element and the compensating element are positioned side by side in a parallel or anti-parallel configuration.

10. The sensor element according to claim 2, wherein the measuring element and the compensating element are configured as concentric cylinders.

11. The sensor element according to claim 2, wherein the measuring element and/or the compensating element consist of a number of single elements making use of the longitudinal or the transversal piezoelectric effect.

12. The sensor element according to claim 2, wherein the measuring element and the compensating element are realized in two partial regions of a single piezoelectric element, with a first partial region carrying the measuring electrodes and a second partial region the compensating electrodes.

13. The sensor element according to claim 12, wherein the two partial regions are configured as concentric cylinders, with the partial region forming the measuring element having greater material thickness than the partial region forming the compensating element.

14. The sensor element according to claim 13, wherein the transition from the lesser material thickness of the compensating element to the greater material thickness of the measuring element is in a form avoiding stress concentration.

15. The sensor element according to claim 12, wherein the electrical connection between the measuring electrodes and the compensating electrodes is implemented by an electrically conductive coating which is directly applied on the piezoelectric element.

16. The sensor element according to claim 1, wherein the compensating element is a resistive element, which preferably is positioned directly adjacent to an electrically inactive surface of the measuring element, extending over the entire length of the measuring element.

17. A sensor element with at least one measuring element, which has piezoelectric and pyroelectric properties and is provided with measuring electrodes, where a measurement variable and a disturbance variable act simultaneously on said measuring element and the measurement signal picked up by the measuring electrodes contains a noise signal, and with at least one compensating element, which has piezoelectric and/or pyroelectric properties and is provided with compensating electrodes, where only the disturbance variable acts on the compensating element, such that a correction signal is picked up by the compensating electrodes, which is used to compensate the noise signal in the measurement signal, wherein the measurement variable is a varying temperature and the disturbance variable is a varying mechanical quantity, for instance force, pressure, stress, or acceleration.

18. A sensor element according to claim 17, wherein the measuring element and the compensating element are placed in the same force field between a compensating element are placed in the same force field between a first and a second measuring element support in a serial configuration, with an electrically and thermally insulating spacer element being provided between measuring element and compensating element.

* * * * *